(12) United States Patent
Whitehead (10) Patent No.: US 8,891,711 B1
(45) Date of Patent: Nov. 18, 2014

(54) ADAPTIVE DE-NOISE FILTERING

(71) Applicant: Amazon Technologies, Inc., Reno, NV (US)

(72) Inventor: Nathan Oliver John Whitehead, Sunnyvale, CA (US)

(73) Assignee: Amazon Technologies, Inc., Reno, NV (US)

( * ) Notice: Subject to any disclaimer, the term of this patent is extended or adjusted under 35 U.S.C. 154(b) by 18 days.

(21) Appl. No.: 13/711,018

(22) Filed: Dec. 11, 2012

(51) Int. Cl.
*H04B 1/10* (2006.01)
*H04L 25/08* (2006.01)

(52) U.S. Cl.
CPC .................................. *H04L 25/08* (2013.01)
USPC ............................. 375/350; 375/227; 375/316

(58) Field of Classification Search
CPC ............... H04R 3/005; H04R 2410/07; H04R 2499/11; H04B 1/1018; H04B 1/1027; H04B 1/1036; G05B 2219/37388; G05B 2219/37507; G05B 2219/40549; H04L 27/2647; H04L 25/08
USPC ......................................... 375/227, 316, 350
See application file for complete search history.

(56) References Cited

U.S. PATENT DOCUMENTS

| 8,068,620 B2 * | 11/2011 | Ikeda ........................... 381/94.1 |
| 8,184,816 B2 * | 5/2012 | Ramakrishnan et al. ....... 381/56 |
| 8,538,582 B2 * | 9/2013 | Sasai ............................. 700/254 |

\* cited by examiner

*Primary Examiner* — Leon Flores
(74) *Attorney, Agent, or Firm* — Sutherland Asbill & Brennan LLP (57) ABSTRACT

Adaptive de-noise filtering of signals is disclosed. A signal may be identified and a noise level corresponding to noise associated with the signal may be determined. The noise level may be determined by isolating the noise from the signal and generating a metric indicative of the noise level. A threshold noise level may be identified. A cutoff frequency may be determined based at least in part on the noise level and the threshold noise level, and, optionally, based on one or more characteristics associated with a low pass filter. The signal may be low pass filtered based at least in part on the cutoff frequency to generate a filtered signal. Additional signals may be identified and filtered in accordance with respective corresponding cutoff frequencies such that noise levels associated with the additional filtered signals and the filtered signal may be substantially the same and at or below the threshold noise level.

25 Claims, 7 Drawing Sheets

ADAPTIVE DE-NOISE FILTERING

BACKGROUND

A variety of types of sensing devices exist for capturing sensory data and generating analog or digital signals representative of the sensory data. Output generated by a sensing device may include undesired signal(s) (e.g., noise) in addition to signal(s) that encode meaningful information. Such noise may include various forms of environmental noise such as electromagnetic interference (EMI), electrical noise associated with other devices, vibrational noise, and so forth. Noise may also be generated from internal operations of a sensing device (e.g., thermal noise).

Various types of analog or digital filters may be used to perform signal separation functions. For example, a filter may be used to separate a signal that is contaminated with interference, noise, or other signals. The design of a filter may be influenced by the nature of the information encoded in a signal. For example, for those applications in which information encoded in the time domain is of importance, time domain parameters (e.g., step response) may be of primary importance in the design of a filter. Alternatively, for certain applications in which information encoded in the frequency domain is of importance, filtering may be performed to allow certain frequencies to pass unaltered, while blocking other frequencies. In such applications, a filter's performance with respect to various frequency domain parameters (e.g., roll-off, passband ripple, stopband attenuation, etc.) may be of particular interest.

BRIEF DESCRIPTION OF THE DRAWINGS

The detailed description is set forth with reference to the accompanying drawings. In the drawings, the left-most digit(s) of a reference numeral identifies the drawing in which the reference numeral first appears. The use of the same reference numerals indicates similar or identical components; however, different reference numerals may be used to identify similar or identical components as well. Various embodiments may utilize elements and/or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

This disclosure relates to adaptive filtering of signals to reduce noise associated with a signal. A variety of types of sensing devices may capture sensory data in the form of analog or digital output signals. Noise may be associated with signals outputted by sensing devices. As used herein, the term "noise" may encompass any undesired addition to a signal. Noise may be generated by a variety of sources and may include environmental noise such as EMI, electrical noise generated by other devices, vibrational noise, shot noise, cosmic noise, and so forth. Noise may further include noise generated internally by a device during operation such as thermal noise. Noise associated with a signal does not reflect information encoded by the signal, and thus noise reduction is desirable in order to analyze the signal and the information encoded by the signal. For example, an output signal generated by a sensing device that is indicative of a sensed parameter may include internal noise generated by the sensing device that is not associated with the sensed parameter.

This disclosure describes techniques for isolating noise associated with a signal, determining a noise level corresponding to the isolated noise, identifying a threshold noise level, determining a cutoff frequency based at least in part on the determined noise level and the identified threshold noise level, and filtering the signal based at least in part on the determined cutoff frequency. In various embodiments, the signal may be subjected to low pass filtering based on the determined cutoff frequency to generate a filtered signal. Thus, according to techniques described herein, a filtered signal may be generated having a noise level that does not exceed the threshold noise level.

The noise may be isolated from the signal in any suitable manner. For example, the signal may be sampled in accordance with a sampling rate. In scenarios in which the signal is an analog signal, sampling of the signal at the sampling rate may result in an analog-to-digital conversion of the signal. Based on the Nyquist-Shannon Sampling Theorem, the digital signal that is generated may be a complete reconstruction of the analog signal as long as the analog signal does not include frequency components above one-half of the sampling rate. Stated another way, the Nyquist-Shannon Sampling Theorem holds that a complete representation of a band-limited signal having a bandwidth B is obtainable as long as the sampling rate is larger than twice the bandwidth B. If the signal includes frequency components above one-half of the sampling rate (also known as the Nyquist frequency), aliasing may occur such that the frequency components above the Nyquist frequency are represented in the digital signal as frequency components below the Nyquist frequency. If frequency components of the signal already exist at the aliased frequencies, a loss of information may occur. Aliasing may be considered a form of noise associated with a signal. Noise may also be generated by undersampling of a signal.

Upon generation of the digital signal, noise associated with the signal may be isolated therefrom. Differentiation, such as a time series difference between sampled signal values, or a suitable high pass filtering technique, may be used to remove the signal and to isolate the noise associated with the signal.

Based on the differentiation, multiple differentiated signal values may be generated. As used herein, the phrase "differentiated signal value" may refer to a value obtained from differentiation of signal samples (e.g., taking a difference between adjacent signal samples). Noise levels associated with various subsets of the differentiated signal values may be determined. For example, a fixed or variable sample window may be used to identify a subset of the differentiation signal values. A noise level associated with the subset of the differentiated signal values may then be determined. As new differentiated signal values are generated based on differentiation of additional samples, the window may be shifted, a new subset of differentiated signal values may be identified, and a noise level associated with the new subset may be determined.

As used herein, the phrase "noise level" may refer to any suitable quantitative metric indicative of noise associated with a signal. Depending on the context, the phrase "noise level" may refer to a quantitative measure of noise associated with a subset of samples or to a quantitative measure of noise associated with a signal as a whole (e.g., all samples that form the digitized signal). Further, the phrase "signal noise level" may be used at times herein such as when referring to noise associated with a signal as a whole. In certain embodiments, the noise level may correspond to a root mean square (rms) noise value. The rms noise value may be obtained based on the spectral noise density and the frequency bandwidth of the sampled signal values. The frequency bandwidth may, in turn, be determined based on the sampling rate in accordance with the Nyquist-Shannon Sampling Theorem.

More specifically, the rms noise value may be determined based on the spectral noise density at any frequency such as the Nyquist frequency. Further, in various embodiments, the threshold noise level may correspond to a desired rms noise value of the filtered signal.

Accordingly, by low pass filtering a signal based on a determined cutoff frequency in accordance with various embodiments of the disclosure, an rms noise value corresponding to noise associated with the signal may be reduced to a desired rms noise value by attenuating noise frequencies above the cutoff frequency. In certain other embodiments, a "noise level" may correspond to a decibel noise value. For example, an rms noise value may be converted to a decibel noise value, and the threshold noise level may correspond to a desired decibel noise value. In still other embodiments, a "noise level" may correspond to a power quantity indicative of an energy or power associated with noise that is associated with a signal. It should be appreciated that the above examples of metrics that may be used to indicate noise level are merely illustrative and that any suitable metric may be used to represent the noise level.

Upon determination of respective noise levels associated with different subsets of differentiated signal values in a time series of values, the respective noise levels may be used to determine a signal noise level corresponding to noise associated with the sampled signal. For example, an averaging or smoothing function (e.g., a simple moving average, a cumulative moving average, a weighted moving average, an exponential moving average, etc.) may be applied to the respective noise levels associated with the different subsets of differentiated signal values to determine the signal noise level. The averaging or smoothing function may be a form of a finite impulse response function or an infinite impulse response function. In certain illustrative embodiments, an exponential moving average (EMA), which may also be known as an exponentially decaying moving average, may be taken of the time series data that includes the noise levels (e.g., rms noise values) of the various subsets of differentiated signal values.

The EMA may apply weighting factors to the noise level time series data that decrease exponentially. An illustrative EMA may be defined recursively for a data series Y such that for t>1, $S_t = \alpha * Y_t + (1-\alpha) * S_{t-1}$. A first value of the EMA may be initialized to any value such as, for example, a first element in the data series (e.g., a noise level determined for an initial subset of differentiated signal values). The weighting factor a may take on a value from 0 to 1. In certain embodiments, the α weighting factor may be relatively small, in which case, noise levels of prior subsets of differentiated signal values may be discounted at a relatively slower rate. In other embodiments, the α weighting factor may be relatively large, in which case, noise levels of prior subsets of differentiated signal values may be discounted at a relatively faster rate.

As the averaging function (e.g., EMA) is applied to an increasing number of noise levels in the time series, the resulting quantity (e.g., the exponentially decaying weighted average) may converge to the signal noise level which may be indicative of a constant noise floor for some period of time. If various factors cause a change in the signal noise level (e.g., a temperature change), the weighted average may again adjust over time to converge to the changed signal noise level. Further, an effect on signal values of any abrupt changes in a parameter being sensed by a sensing device may be smoothed out by application of the averaging function.

As described above, application of an averaging function to the time series data that includes determined noise levels for subsets of differentiated signal values may generate a value indicative of noise associated with the signal. A threshold noise level may then be identified. In various embodiments, the threshold noise level may represent a desired noise floor for the signal. A cutoff frequency may then be determined based on the signal noise level and the threshold noise level such that low pass filtering of the signal based on the cutoff frequency may result in a reduction of the signal noise level to a level at or below the threshold noise level.

In certain embodiments, low pass filtering of the signal based at least in part on the determined cutoff frequency may include allowing signal frequencies within a passband (e.g., below the cutoff frequency) to pass unaltered while attenuating signal frequencies that are higher than the passband frequencies (e.g., above the cutoff frequency). A stopband may refer to a band of frequencies at which signal attenuation is at least a specified amount greater than a nominal passband attenuation. A transition band may be present between the passband and the stopband. A slope of a roll-off may determine a width of the transition band, and the cutoff frequency may represent a division between the passband and the transition band. By low pass filtering the signal based on the determined cutoff frequency, noise frequencies above the cutoff frequency may be sufficiently attenuated so as to be effectively removed from the signal. Accordingly, a spectral noise density of the filtered signal may be reduced such that a noise level of the filtered signal may be reduced to within the threshold noise level.

In certain embodiments, noise associated with a signal may be white noise (e.g., noise having a constant power spectral density over some finite bandwidth). For example, internal components of a system (e.g., a sensing device) may generate broad spectrum noise having a relatively constant power spectral density, and thus may be treated as white noise in various embodiments. In such embodiments, a cutoff frequency may be chosen such that a noise level (e.g., an rms noise value) associated with the low pass filtered signal does not exceed a desired threshold noise level.

In various embodiments, the cutoff frequency chosen may be dynamically altered based on changes in the signal noise level. For example, if an increase in the signal noise level is detected, the cutoff frequency may be correspondingly lowered, thereby narrowing the bandwidth of the passband of the low pass filter and causing attenuation of additional noise frequencies above the now lowered cutoff frequency. Accordingly, a noise level associated with the filtered signal outputted from the low pass filter may be maintained at or below the threshold noise level. Conversely, if a signal noise level decreases, the cutoff frequency may be correspondingly increased, thereby widening the bandwidth of the passband and allowing additional noise frequencies to pass through the low pass filter while still maintaining the signal noise level at or below the threshold noise level. An increase in the cutoff frequency may, potentially, permit higher frequency components of the signal that encodes meaningful information to pass through the low pass filter. It should be appreciated that a trade-off may exist between the threshold noise level attainable through adjustment of the cutoff frequency and the potential loss of meaningful information encoded in higher frequencies of the signal. Accordingly, in various embodiments, a minimum threshold noise level may exist such that aggressive low pass filtering of a signal to attain a noise floor at or below the minimum threshold noise level may result in loss of higher frequency components of the signal of interest (e.g., the signal that encodes meaningful information).

Figure 1:
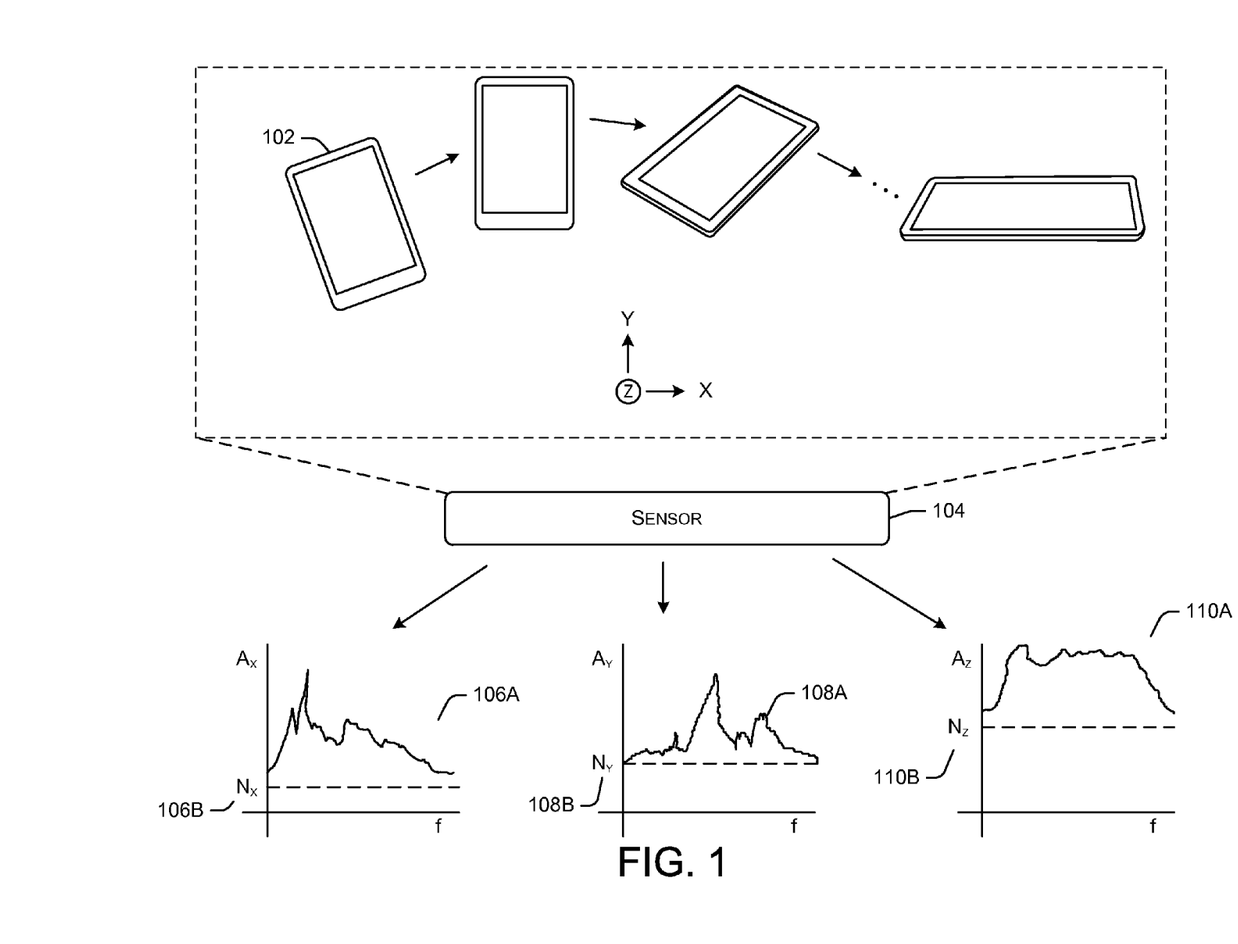
FIG. 1 schematically depicts an illustrative use case scenario in which a sensing device that may be associated with an electronic device generates various signals indicative of a sensed parameter in accordance with one or more embodiments of the disclosure.

In one or more additional embodiments of the disclosure, techniques disclosed herein may be applicable to a plurality of signals that may each encode related information associated with a same sensed parameter or related sensed parameters. For example, FIG. 1 schematically depicts an illustrative use case scenario in which a sensing device 104 that may be associated with an electronic device 102 generates a plurality of signals indicative of a sensed parameter.

In an illustrative embodiment, the sensing device 104 may be, for example, an accelerometer provided in connection with the electronic device 102. The electronic device 102 may be any suitable device including, but not limited to, a smartphone or other cellular device, a tablet device with network connectivity and, optionally, cellular capabilities, an electronic reader device, a desktop computing device, a laptop computing device, a mainframe computing device, a game console, a multimedia content streaming device, and so forth. The sensing device 104 may be, for example, a Micro Electro-Mechanical Systems (MEMS) accelerometer configured to sense forces due to acceleration and may be used to sense a tilt or orientation of the electronic device 102 with respect to a reference plane. User interface characteristics (e.g., an orientation of information presented via a display of the electronic device 102) may be adjusted based on a device orientation or tilt sensed by the sensing device 104. In various embodiments, the sensing device 104 may be provided as part of the electronic device 102 (e.g., as an internal component of the electronic device 102).

The sensing device 104 may be configured to generate analog output signals 106A, 108A, 110A (e.g., a continuous voltage) or digital output signals (e.g. a pulse width modulated voltage signal) having a known proportionality to acceleration. The sensing device 104 may be, for example, a multi-axis accelerometer configured to sense acceleration along multiple axes (e.g., x, y, and z axes). Accordingly, each of the output signals 106A, 108A, 110A may be indicative of a component acceleration sensed along a respective axis of a coordinate system associated with the sensing device 104 and/or the electronic device 102.

Respective noise may be associated with each of the output signals 106A, 108A, 110A. In certain embodiments, noise associated with the output signals 106A, 108A, 110A may be white noise. For example, internal components of the sensing device 104 may generate broad spectrum noise having a relatively constant power spectral density, and thus may be treated as white noise in various embodiments. In certain embodiments, as depicted in FIG. 1, varying levels of noise may be associated with each output signal 106A, 108A, 110A. For example, in the illustrative frequency domain signal representations depicted in FIG. 1, a greater noise level $N_y$ 108B is present in the output signal 108A as compared to a noise level $N_x$ 106B present in the output signal 106A. Further, a greater noise level $N_x$ 110B is present in the output signal 110A as compared to the noise level $N_x$ 106B and the noise level $N_y$ 108B.

Varying levels of noise associated with each output signal 106A, 108A, 110A may be the result of any number of factors. As a non-limiting example, improper or inadequate calibration of the sensing device 104 at a time of manufacture may result in different noise characteristics along different axes of the sensing device 104. Moreover, even if ideal calibration is assumed, other external characteristics such as temperature fluctuations, changes in electrical noise characteristics of the sensing device 104 or other devices provided in proximity to the sensing device 104, and so forth may result in varying noise characteristics along different axes of the sensing device 104. It should be appreciated that any number of factors may influence noise characteristics associated with signals generated by the sensing device 104.

As will be described in further detail later in this disclosure, each of the output signals 106A, 108A, 110A may be sampled at a respective sampling rate, which may correspond to a same sampling rate or different sampling rates. In scenarios in which the signals 106A, 108A, 110A are analog signals, sampling of the signals may result in analog-to-digital conversion of each of the signals to generate respective corresponding digital signals. Upon generation of the digital signals, respective noise associated with each of the signals may be isolated. Differentiation, such as a time series difference between adjacent sampled signal values, or an alternative high pass filtering technique, may be used to remove the respective signals 106A, 108A, 110A and to isolate the respective noise associated with each signal. Based on the differentiation, multiple differentiated signal values may be generated with respect to each signal. Using a similar technique as described earlier, noise levels associated with various subsets of the differentiated signal values may be determined with respect to each signal and an averaging function may be applied to generate noise values, where each noise value is indicative of a noise level corresponding to noise associated with a respective signal of the output signals 106A, 108A, 110A.

A threshold noise level may then be identified. In various embodiments, the threshold noise level may be based at least in part on at least one of the determined signal noise levels of the output signals 106A, 108A, 110A. As a non-limiting example, the threshold noise level may correspond to some fraction of the lowest noise level among the respective signal noise levels determined for each of the output signals 106A, 108A, 110A. Respective cutoff frequencies may then be determined based on a corresponding signal noise level and the threshold noise level. The cutoff frequencies may be chosen such that low pass filtering of each of the output signals 106A, 108A, 110A in accordance with a respective corresponding cutoff frequency generates corresponding filtered signals having substantially the same noise levels associated therewith. For example, because a signal noise level $N_z$ 110B is greater than a signal noise level $N_y$ 108B, a cutoff frequency chosen for output signal 110A may be lower than a cutoff frequency chosen for output signal 108A. As a result, output signal 110A may be more aggressively filtered in order to generate a filtered signal having an associated noise level that is substantially the same as a noise level associated with a filtered signal generated from low pass filtering of the output signal 108A, both of which may fall within the threshold noise level. Similarly, a respective cutoff frequency may be chosen for output signal 106A such that low pass filtering of the output signal 106A in accordance with the chosen cutoff frequency generates a filtered signal having a noise level associated therewith that is comparable to the noise levels of the other filtered signals and which also falls within the threshold noise level.

While various embodiments of the disclosure have been described above and may be described later in this disclosure with respect to particular types of devices (e.g., accelerometers, electronic devices, etc.), it should be appreciated that adaptive de-noising filtering techniques and methodologies described herein are applicable to signals produced or generated by any signal source or signal generator. The signal source or signal generator may include, but is not limited to, any type of sensor or other sensing device configured to capture sensory data in the form of one or more signals.

In addition, while adaptive de-noise filtering techniques and methodologies disclosed herein may be described in the context of digital filtering, it should be appreciated that such techniques and methodologies may be implemented in the context of analog filtering. For example, one or more analog signals may be filtered using an analog high pass filtering technique to isolate respective noise included in each signal, respective noise levels corresponding to the isolated noise may be determined, a threshold noise level may be identified, respective cutoff frequencies may be determined based on the respective determined noise levels and the identified threshold noise level, and the one or more analog signals may be filtered using an analog low pass filtering technique to generate respective filtered signals having associated noise levels that fall within the threshold noise level, and which, optionally, may be substantially the same.

The embodiments described above as well as additional embodiments of the disclosure will be described in greater detail through reference to the accompanying drawings.

Illustrative Architecture

Figure 2:
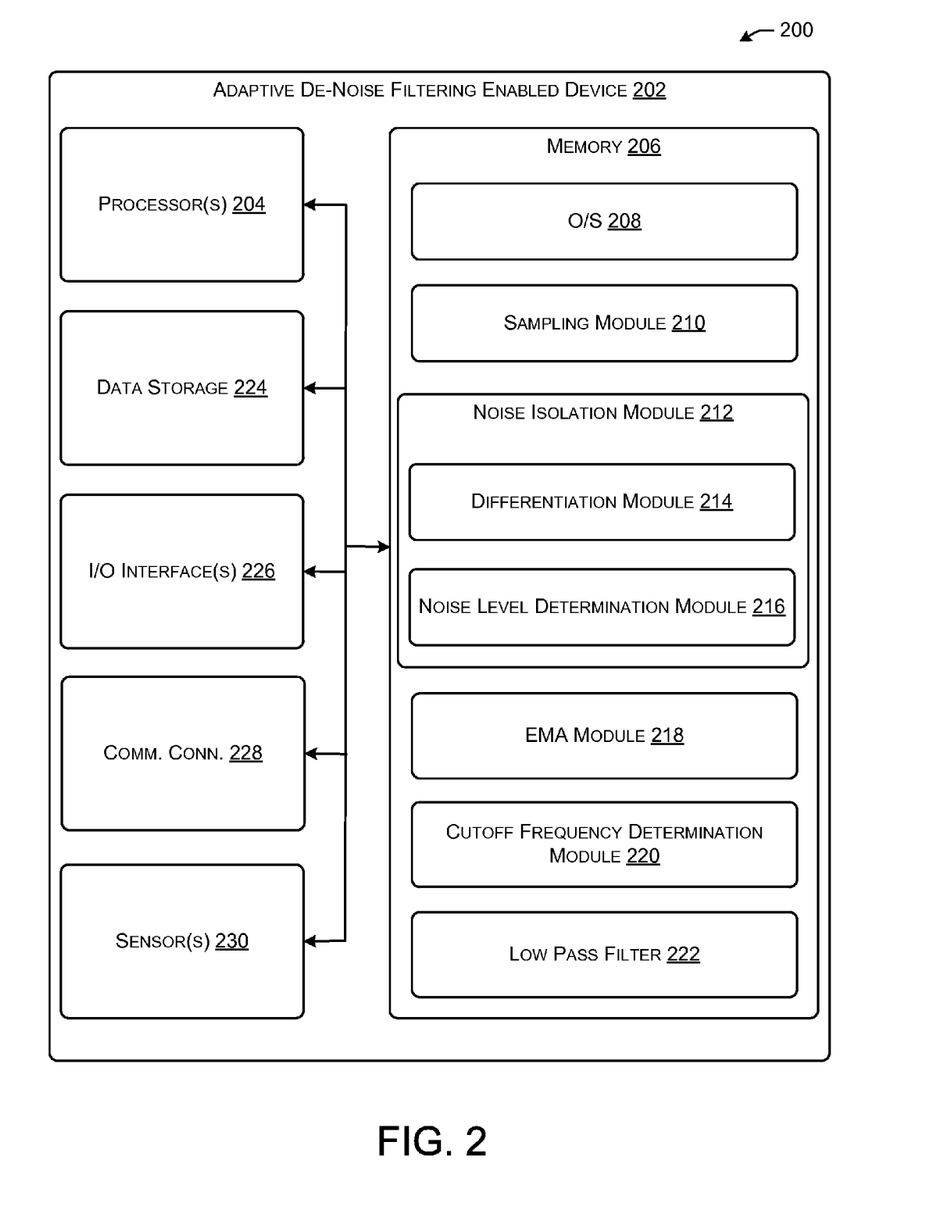
FIG. 2 schematically depicts an illustrative architecture for facilitating adaptive de-noise filtering in accordance with one or more embodiments of the disclosure.

FIG. 2 schematically depicts an illustrative architecture for facilitating adaptive de- noise filtering in accordance with one or more embodiments of the disclosure. Various hardware and software components of an illustrative adaptive de-noise filtering enabled device 202 are shown. The device 202 may be an electronic device such as any of those previously described. However, embodiments of the disclosure are not so limited, and the device 202 may be any device that includes or is associated with one or more components (e.g., sensing devices) that generate signals that encode information relating to one or more sensed parameters. Adaptive de-noise filtering techniques disclosed herein may be applied to such signals.

The device 202 may include one or more processors (processor(s)) 204 and one or more memories 206 (hereinafter collectively or individually referred to as memory 206). The processor(s) 204 may include any suitable processing unit capable of accepting digital data as input, processing the input data based on stored computer-executable instructions, and generating output data. The computer-executable instructions may be stored, for example, in the memory 206 and may include operating system software, application software, program modules, and so forth. The processor(s) 204 may be configured to execute the computer-executable instructions to cause various operations to be performed. The processor(s) 204 may include any type of processing unit including, but not limited to, a central processing unit, a microprocessor, a microcontroller, a Reduced Instruction Set Computer (RISC) microprocessor, an Application Specific Integrated Circuit (ASIC), and so forth.

The memory 206 may store program instructions that are loadable and executable by the processor(s) 204, as well as data manipulated and generated by the processor(s) 204 during execution of the program instructions. Depending on the configuration and implementation of the device 202, the memory 206 may be volatile memory (memory that is not configured to retain stored information when not supplied with power) such as random access memory (RAM) and/or non-volatile memory (memory that is configured to retain stored information even when not supplied with power) such as read-only memory (ROM), flash memory, and so forth. In various implementations, the memory 206 may include multiple different types of memory, such as static random access memory (SRAM), dynamic random access memory (DRAM), unalterable ROM, and/or writeable variants of ROM such as electrically erasable programmable read-only memory (EEPROM), flash memory, and so forth.

The device 202 may further include additional data storage 224 such as removable storage and/or non-removable storage including, but not limited to, magnetic storage, optical disk storage, and/or tape storage. Data storage 224 may provide non-volatile storage of computer-executable instructions and other data. The memory 206 and/or the data storage 224, removable and/or non-removable, are examples of computer-readable storage media (CRSM).

The device 202 may further include communications connection(s) 228 that allow the device 202 to communicate with other devices or application software via one or more networks. The device 202 may additionally include one or more input/output (I/O) interfaces 226 (and optionally associated software components such as device drivers) that may support various I/O devices, such as a keyboard, a mouse, a pen, a voice input device, a touch input device, a display, speakers, a camera, a microphone, a printer, and so forth, for receiving user input and/or providing output to a user.

The device 202 may further include various other hardware component(s) and associated software component(s). For example, the device 202 may include one or more sensing devices 230 for sensing one or more parameters associated with operation of the device 202. One or more dedicated processors (e.g., any one or more of the processor(s) 204) may be associated with the sensing device(s) 230. As a non-limiting example, the device 202 may include an accelerometer (e.g., a multi-axis accelerometer) configured to sense forces along one or more axes due to acceleration of the device 202. As another non-limiting example, the device 202 may include a temperature sensor for sensing internal temperature fluctuations. It should be appreciated that the above examples are merely illustrative and that the device 202 may include any number of various types of sensing devices capable of generating signals indicative of sensed parameter(s). The device 202 may further include any number of additional hardware and/or software components not depicted in FIG. 2.

Referring again to the memory 206, various modules may be stored therein that comprise computer-executable instructions that upon execution by the processor(s) 204 cause various operations to be performed. For example, the memory 206 may have loaded therein an operating system (O/S) 208 that provides an interface between other application software executing on the device 202 and hardware resources of the device 202. More specifically, the O/S 208 may include a set of computer-executable instructions for managing hardware resources of the device 202 and for providing common services to other application programs (e.g., managing memory allocation among various application programs). The O/S 208 may include any operating system now known or which may be developed in the future including, but not limited to, a Microsoft Windows® operating system, an Apple OSX™ operating system, Linux, Unix, a mainframe operating system such as Z/OS, a mobile operating system, or any other proprietary or freely available operating system.

The memory 206 may additionally include various other program modules that provide various associated functionality. For example, the memory 206 may include a sampling module 210, a noise isolation module 212, an exponential moving average (EMA) module 218, a cutoff frequency determination module 220, and a low pass filter 222. The noise isolation module 212 may further include various sub-modules such as a differentiation module 214 and a noise level determination module 216. The various functionalities provided by these modules will be described in more detail through reference to the hybrid system and data flow diagram of FIG. 3.

It should be appreciated that functionality described herein as being provided by a particular program module may, in various embodiments, be performed by one or more other depicted program modules and/or by one or more additional modules not depicted. Further, in various embodiments, certain program modules that are depicted may not be provided. In addition, it should be appreciated that the program modules depicted as being loaded into the memory 206 may, in various embodiments, represent a logical partitioning of associated functionality. Accordingly, any particular program module may represent a logical construct and may not correspond to a partitioning of associated software, firmware, and/or hardware component(s).

Figure 3:
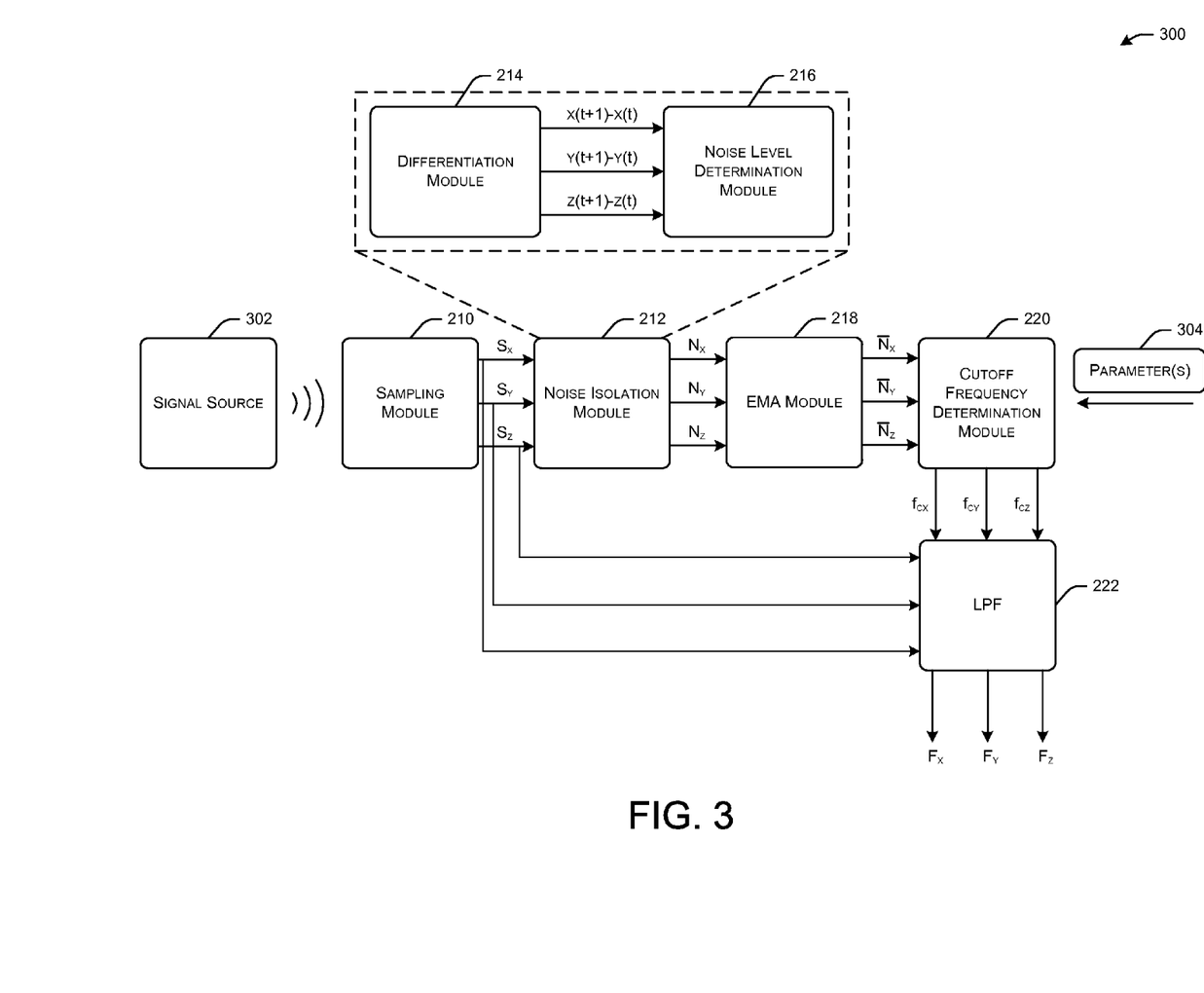
FIG. 3 is a hybrid system and data flow diagram schematically depicting an illustrative technique for adaptive de-noise filtering in accordance with one or more embodiments of the disclosure.

FIG. 3 is a hybrid system and data flow diagram schematically depicting an illustrative technique for adaptive de-noise filtering in accordance with one or more embodiments of the disclosure. While the adaptive de-noise filtering technique depicted in FIG. 3 may be described through reference to the illustrative architecture depicted in FIG. 2, it should be appreciated that adaptive de-noise filtering techniques and methodologies disclosed herein are not limited to the particular architecture of FIG. 2 but rather are applicable to any of a variety of suitable architectures.

Referring to FIG. 3, a signal source 302 is depicted. The signal source 302 may be, for example, a sensing device (e.g., any of sensor(s) 230) configured to capture sensory data in the form of signals indicative of values of one or more sensed parameters as a function of an independent variable (e.g., time).

One or more signals generated by the signal source 302 may be sampled by the sampling module 210. For example, the sampling module 210 may be implemented in hardware and/or software and may include computer-executable instructions that upon execution by the processors 204 cause signal(s) received from the signal source 302 to be sampled in accordance with one or more specified sampling rates. In certain embodiments, each of the signals received from the signal source 302 may be sampled in accordance with a same sampling rate, while in other embodiments different sampling rates may be used. In various embodiments, the sampling rate at which a particular signal is sampled may be determined based on the range of frequencies present in the signal. For example, if possible, a sampling rate that is at least twice that of the highest frequency component of a signal may be chosen to sample the signal. In scenarios in which the signal(s) received from the signal source 302 are analog signals, sampling of the signal(s) by the sampling module 210 may result in an analog-to-digital conversion of the signal(s) and generation of digitized signals. Three digital signals $S_x$, $S_y$, $S_z$ are depicted in FIG. 3 as being generated and may respectively correspond to three different analog signals received from the signal source 302 (e.g., a multi-axis accelerometer). However, it should be appreciated that any number of digital signals may be generated by the sampling module 210 and that adaptive de-noise filtering techniques disclosed herein may be applied to any number of signals.

Still referring to the illustrative data flows depicted in FIG. 3, the sampled digital signals $S_x$, $S_y$, $S_z$ may be input to the noise isolation module 212. In various embodiments, the noise isolation module 212 may include computer-executable instructions that when executed by the processor(s) 204 result in isolation of respective noise from each of the signals and cause determinations of respective corresponding noise levels to be made. The noise isolation module 212 may include the differentiation module 214 and the noise level determination module 216.

The differentiation module 214 may include computer-executable instructions that when executed by the processor(s) 204 cause a differentiation to be performed on the sampled signal values of each of the signals $S_x$, $S_y$, $S_z$. For example, the differentiation module 214 may include computer-executable instructions for performing a time series difference between sampled signal values for each of the signals $S_x$, $S_y$, $S_z$ to generate multiple respective differentiated signal values for each signal. As a result of the differentiation performed by the differentiation module 214, frequency components of each signal may be effectively removed and respective noise associated with each signal may be isolated. While differentiation is depicted as an illustrative technique for isolating noise from the signals $S_x$, $S_y$, $S_z$, it should be appreciated that any suitable technique (e.g., high pass filtering) may be used to remove the signal components and isolate respective noise associated with each signal.

The differentiated signal values generated for each of the signals $S_x$, $S_y$, $S_z$ by the differentiation module 214 may be input to the noise level determination module 216. The noise level determination module 216 may include computer-executable instructions for determining noise levels associated with various subsets of the differentiated signal values. For example, a fixed or variable window may be used to identify a subset of the differentiated signal values associated with a particular signal. A noise level (e.g., an rms noise value, a decibel noise value, a noise power value, etc.) associated with the subset of the differentiated signal values may then be determined. As new differentiated signal values are generated based on differentiation of additional samples, the window may be shifted, a new subset of differentiated signal values may be identified, and a noise level associated with the new subset may be determined. This process may be performed in connection with each of the signals $S_x$, $S_y$, $S_z$.

For each of the signals $S_x$, $S_y$, $S_z$, respective noise levels associated with different subsets of differentiated signal values in a time series of values may be supplied to the EMA module 218. The symbols $N_x$, $N_y$, $N_z$ depicted in FIG. 3 represent the time series of differentiated signal values generated for signals $S_x$, $S_y$, $S_z$ respectively. The EMA module 218 may include computer-executable instructions for applying an averaging function (e.g., an exponential moving average function) to received noise levels to generate an exponentially decaying moving average that is indicative of a signal noise level (e.g., a noise level of noise associated with a signal). More specifically, taking signal $S_x$ for example, the EMA module 218 may generate an exponential moving average based on respective noise levels determined for various subsets of differentiated signal values associated with the signal $S_x$. The moving average may be indicative of a signal noise level associated with the signal $S_x$. Similarly, respective signal noise levels may be determined for the other signals. While an EMA module 218 that generates exponential moving averages is illustratively depicted in FIG. 3, it should be appreciated that any module capable of applying any suitable averaging or smoothing function to noise level values received from the noise level determination module 216 in order to generate values indicative of signal noise levels may be provided.

Still referring to FIG. 3, signal noise values $N_x$, $N_y$, $N_z$ generated by the EMA module 218 for signals $S_x$, $S_y$, $S_z$, respectively, may be provided as input to the cutoff frequency determination module 220. Various parameter(s) 304 may also be provided to the cutoff frequency determination module 220. The parameter(s) 304 may include, for example, a threshold noise level. The threshold noise level may correspond to a desired noise floor to be obtained upon low pass filtering of the signals $S_x$, $S_y$, $S_z$. The cutoff frequency determination module 220 may include computer-executable instructions for determining a respective cutoff frequency for each of the signals $S_x$, $S_y$, $S_z$ based on the corresponding signal noise value (e.g., $N_x$, $N_y$, $N_z$) associated with the signal and the threshold noise level. The respective cutoff frequency determined for a particular signal may be a frequency such that low pass filtering of the signal in accordance with the cutoff frequency generates a filtered signal having an associated noise level (e.g., a noise floor) that is within the threshold noise level. The cutoff frequency associated with a particular signal may be further determined based at least in part on one or more characteristics associated with a low pass filter that may be used to filter the signal. For example, in conjunction with the threshold noise level and an associated signal noise value, a roll-off slope of the low pass filter, which determines a rate of attenuation of signal frequencies above the cutoff frequency, and which may, in turn, be determined based on the type of low pass filter, may influence the cutoff frequency chosen for a particular signal.

Cutoff frequencies $f_{cx}$, $f_{cy}$, $f_{cz}$ identified for the signals $S_x$, $S_y$, $S_z$, respectively, may be supplied as input to the low pass filter (LPF) 222. The signals $S_x$, $S_y$, $S_z$ may also be supplied as input to the LPF 222. LPF 222 may be any suitable low pass filter including, but not limited to, an infinite impulse response (IIR) filter such as a Butterworth filter, a Chebyshev filter, a Bessel filter, and so forth, a finite impulse response (FIR) filter, or any other suitable low pass filter. Further, LPF 222 may be a first, second, or any other higher order low pass filter and may include any number of poles. As a non-limiting example, LPF 222 may be a first-order, single- pole Butterworth filter. The type of filter that is used may determine various filter characteristics such as, for example, the power roll-off (e.g., the roll-off slope).

Low pass filtering of the signals $S_x$, $S_y$, $S_z$ in accordance with the respective cutoff frequencies $f_{cx}$, $f_{cy}$, $f_{cz}$ by LPF 222 may generate respective filtered signals $F_x$, $F_y$, $F_z$. A respective signal noise level associated with each of the filtered signals $F_x$, $F_y$, $F_z$ may be within the threshold noise level. That is, for a particular signal, a corresponding cutoff frequency may be chosen such that low pass filtering of the signal in accordance with the cutoff frequency generates a filtered signal having an associated noise level that does not exceed the threshold noise level. Depending on the signal noise level associated with the unfiltered signal, more or less aggressive filtering may be performed in order to generate a filtered signal having a suitable noise floor. Accordingly, a first signal having an associated signal noise level that deviates more from the threshold noise level than the signal noise level associated with a second level may be more aggressively filtered using a relatively lower cutoff frequency. In doing so, more high frequency components of the first signal may be lost as a result of the filtering than may be lost in connection with filtering of the second signal.

In various embodiments, the signals $S_x$, $S_y$, $S_z$ may encode related information. For example, the signals $S_x$, $S_y$, $S_z$ may encode information associated with one or more same or related sensed parameters. Accordingly, in certain embodiments, it may be desirable to generate filtered signals from the signals $S_x$, $S_y$, $S_z$ that have substantially the same noise floors. In such scenarios, adaptive de-noise filtering techniques described herein may be used to identify respective cutoff frequencies for each of the signals $S_x$, $S_y$, $S_z$ such that filtering the signals in accordance with the respective cutoff frequencies generates filtered signals, each having an associated respective signal noise level that corresponds to a threshold noise level. The threshold noise level may be chosen based at least in part on at least one of the determined signal noise levels. For example, the threshold noise level may correspond to some fraction of the lowest signal noise level, a weighted combination of the signal noise levels for multiple signals, and so forth.

Further, in various embodiments, the cutoff frequency chosen may be dynamically altered based on changes in the signal noise level. For example, if an increase in the signal noise level is detected, the cutoff frequency may be correspondingly lowered, thereby narrowing the bandwidth of the passband of the low pass filter and causing attenuation of additional noise frequencies and, potentially, frequency components of the signal above the now lowered cutoff frequency. Accordingly, a noise level associated with the filtered signal outputted from the low pass filter may be maintained at or below the threshold noise level. Conversely, if a signal noise level decreases, the cutoff frequency may be correspondingly increased, thereby widening the bandwidth of the passband and allowing additional noise frequencies to pass through the low pass filter while still maintaining the noise floor of the filtered signal to within the desired threshold noise level. Increasing the cutoff frequency may potentially result in higher frequency components of the signal that encodes meaningful information passing through the low pass filter.

While illustrative techniques and methodologies for adaptive de-noise filtering have been described with respect to the illustrative architectures of FIGS. 2 and 3, it should be appreciated that numerous other configurations are possible for implementing the illustrative techniques and methodologies disclosed herein. Accordingly, embodiments of the disclosure are not limited to any particular architectural configuration.

Illustrative Processes

Figure 4:
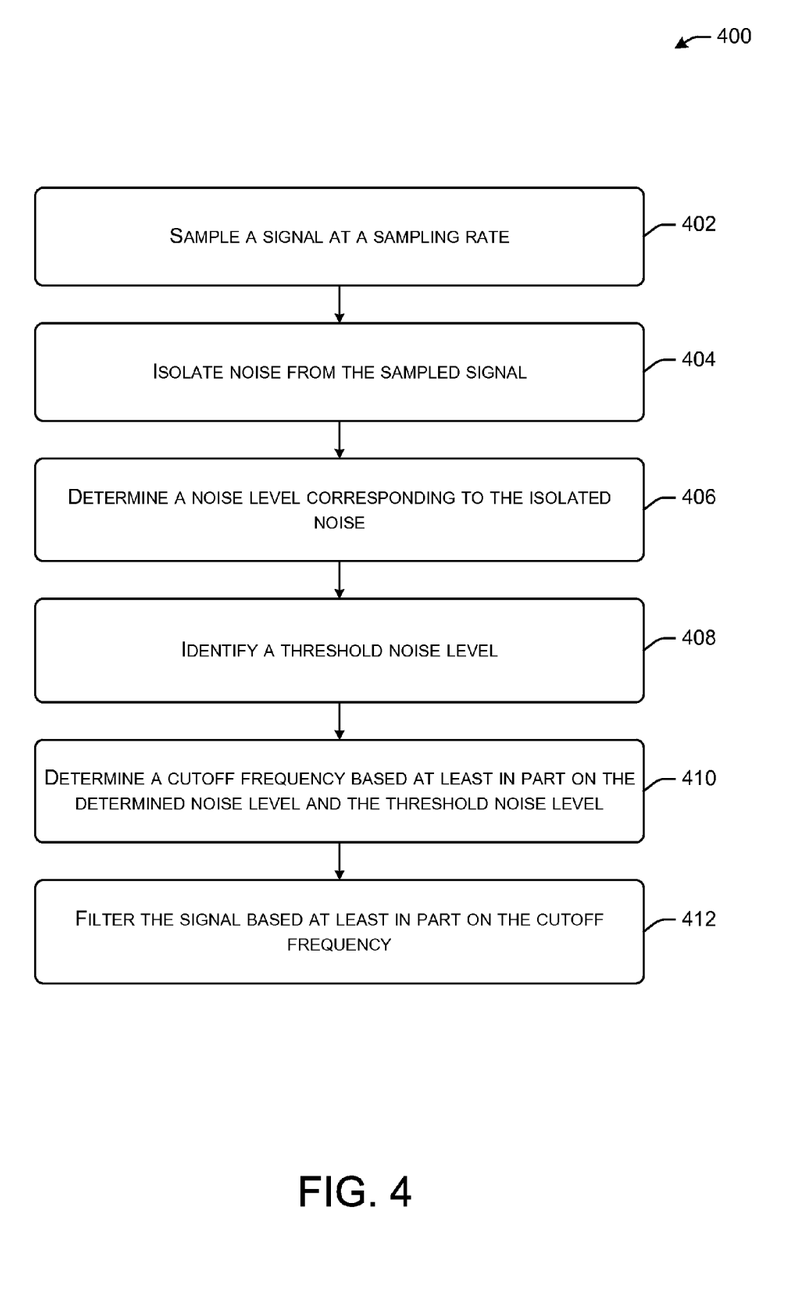
FIG. 4 is a process flow diagram of an illustrative method for adaptive de-noise filtering of a signal in accordance with one or more embodiments of the disclosure.

FIG. 4 is a process flow diagram of an illustrative method 400 for adaptive de-noise filtering of a signal in accordance with one or more embodiments of the disclosure. At block 402, a signal, such as an analog signal generated by a sensing device, may be sampled at a specified sampling rate in order to generate a digital signal that is representative of the signal being sampled.

At block 404, noise included in or otherwise associated with the sampled signal may be isolated therefrom. Noise may be isolated from the signal according to any of the techniques previously described. For example, differentiation may be applied to sampled signal values in order to generate differentiated signal values that have the underlying signal effectively removed therefrom. In one or more other embodiments, any suitable high pass filtering technique may be employed. High pass filtering of the signal assumes that a broad spectrum noise that has a relatively constant spectral density across a range of frequencies is present in the signal.

At block 406, a noise level corresponding to the isolated noise may be determined. The signal noise level may be determined in accordance with any suitable technique including any of the techniques previously described. For example, respective noise levels (e.g., rms noise values) may be determined for each of multiple subsets of differentiated signal values and an averaging or smoothing function may be applied to the respective noise levels to generate a value (e.g., an exponential moving average) indicative of a signal noise level.

At block 408, a threshold noise level may be identified. The threshold noise level may be determined based on any suitable parameter(s). For example, the threshold noise level may be some fraction of the signal noise level.

At block 410, a cutoff frequency may be determined based at least in part on the determined signal noise level and the threshold noise level. The cutoff frequency may be determined further based at least in part on one or more characteristics of a low pass filter (e.g., a roll-off rate). The cutoff frequency may be chosen such that low pass filtering of the signal in accordance with the cutoff frequency causes attenuation of noise frequencies above the cutoff frequency and results in a decrease in the signal noise level to at or below the threshold noise level.

At block 412, the signal may be filtered based at least in part on the cutoff frequency. For example, the signal may be filtered using a low pass filter thereby generating a filtered signal having an associated signal noise level that corresponds to the threshold noise level. By low pass filtering the signal in accordance with the determined cutoff frequency, noise components having frequencies above the cutoff frequency may be sufficiently attenuated, thereby resulting in a reduction in the total noise power and a signal noise level for the filtered signal that is at or below the threshold noise level.

Figure 5:
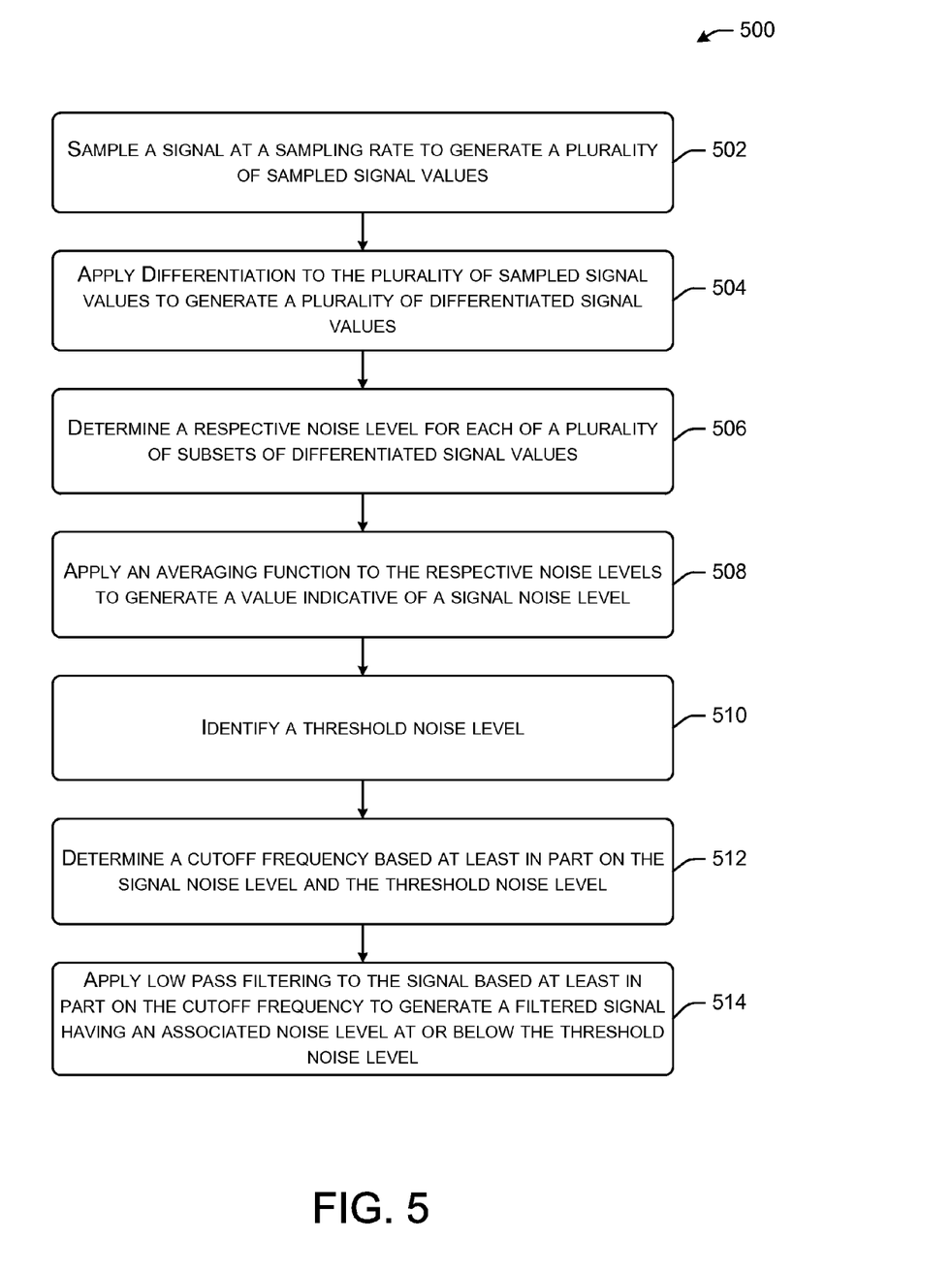
FIG. 5 is a process flow diagram of another illustrative method for adaptive de-noise filtering of a signal in accordance with one or more embodiments of the disclosure.

FIG. 5 is a process flow diagram of an illustrative implementation of an illustrative method 500 for adaptive de-noise filtering of a signal in accordance with one or more embodiments of the disclosure.

At block 502, a signal, such as an analog signal generated by a sensing device, may be sampled at a specified sampling rate in order to generate a plurality of sampled signal values. The sampling rate may be chosen according to any suitable criteria. For example, if possible, a sampling rate that is more than twice the highest frequency component of the signal being sampled may be chosen in order to allow for complete reconstruction of the signal. Alternatively, a highest possible sampling rate permitted by the hardware and/or software component(s) used to sample the signal may be chosen without regard to component frequencies of the signal.

At block 504, differentiation may be applied to the plurality of sampled signal values in order to generate a plurality of differentiated signal values that have the underlying signal effectively removed therefrom.

At block 506, a respective noise level may be determined for each of a plurality of subsets of differentiated signal values. The respective noise levels may include any suitable metric for quantifying noise including, but not limited to, an rms noise value, a decibel noise value, a total noise power value, and so forth.

At block 508, an averaging function may be applied to the respective noise levels determined at block 506. The averaging function may correspond to, for example, an exponential moving average function. The output of the averaging function may be a value that is indicative of a signal noise value associated with the signal. The value may be a smoothed value that discounts the effects of changes to the signal that are unrelated to the noise included in the signal (e.g., changes in sensory data captured by the signal).

At block 510, a threshold noise level may be identified. The threshold noise level may be determined based on any suitable parameter(s). For example, the threshold noise level may be some fraction of the signal noise level.

At block 512, a cutoff frequency may be determined based at least in part on the determined signal noise level and the threshold noise level. The cutoff frequency may be determined further based at least in part on one or more characteristics of a low pass filter (e.g., a roll-off rate).

At block 514, the signal may be filtered based at least in part on the cutoff frequency. For example, the signal may be filtered using a low pass filter thereby generating a filtered signal having an associated signal noise level that corresponds to the threshold noise level. By low pass filtering the signal in accordance with the determined cutoff frequency, noise components having frequencies above the cutoff frequency may be sufficiently attenuated, thereby resulting in a reduction in the total noise power and a signal noise level for the filtered signal that is at or below the threshold noise level.

Figure 6:
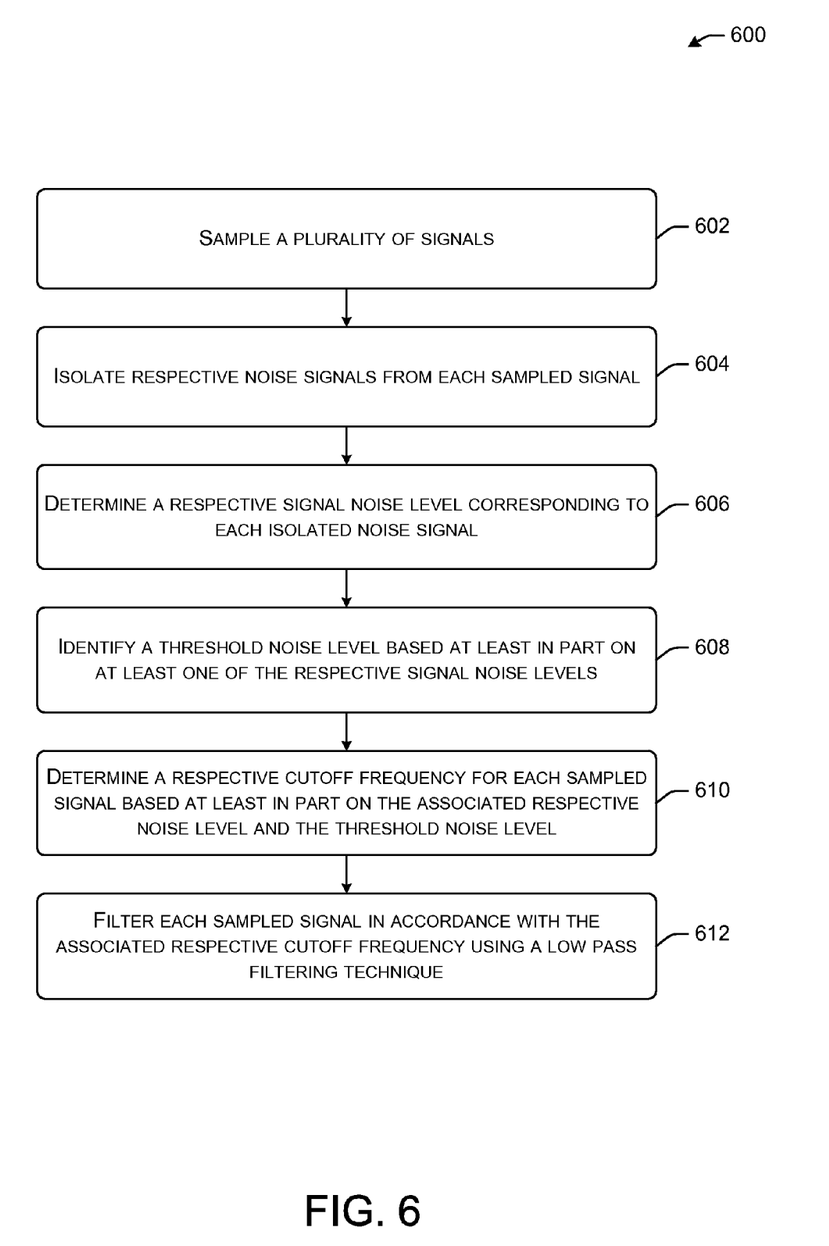
FIG. 6 is a process flow diagram of an illustrative method for adaptive de-noise filtering of a plurality of signals that may encode related information in accordance with one or more embodiments of the disclosure.

FIG. 6 is a process flow diagram of an illustrative method 600 for adaptive de-noise filtering of a plurality of signals that may encode related information in accordance with one or more embodiments of the disclosure.

At block 602, a plurality of signals may be sampled to generate, for example, a plurality of digital signals. The operations at block 602 may not be performed in those embodiments in which the signal is filtered using an analog high pass filter. The plurality of signals may, in various embodiments, encode related information. For example, the plurality of signals may be representative of one or more same or related parameters being sensed. As a non-limiting example, the plurality of signals may represent signals generated by a multi-axis device (e.g., accelerometer), where each signal represents a component parameter (e.g., acceleration) detected along a particular axis. One of ordinary skill in the art will appreciate that the plurality of signals may be related in any number of ways.

At block 604, respective noise included in or otherwise associated with each of the plurality of sampled signals may be isolated therefrom. Respective noise may be isolated from each of the plurality of signals according to any of the techniques previously described. For example, differentiation may be applied to sampled signal values of each signal in order to generate respective differentiated signal values that have the underlying signal effectively removed therefrom. In one or more other embodiments, any suitable high pass filtering technique may be employed.

At block 606, a respective noise level corresponding to each isolated signal noise may be determined. The respective signal noise levels may be determined in accordance with any suitable technique including any of the techniques previously described. For example, for each signal, respective noise levels (e.g., rms noise values) may be determined for each of multiple subsets of differentiated signal values associated with the signal and an averaging function may be applied to the respective noise levels to generate a value (e.g., an exponential moving average) indicative of a signal noise level.

At block 608, a threshold noise level may be identified based at least in part on at least one of the determined signal noise levels. For example, the threshold noise level may be some weighted combination of one or more of the determined signal noise levels. In various embodiments, the plurality of signals may encode related information, and as such, it may be desirable to establish substantially the same threshold noise level for each signal. For example, a threshold noise level corresponding to the minimum signal noise level or some fraction thereof may be identified.

At block 610, a respective cutoff frequency may be determined for each signal based at least in part on the signal noise level associated with the signal and the threshold noise level. The cutoff frequency may be determined further based at least in part on one or more characteristics of a low pass filter (e.g., a roll-off rate). Those signals having associated signal noise values that deviate a greater amount from the threshold noise level may have lower associated cutoff frequencies to facilitate more aggressive low pass filtering of the signal.

At block 612, each of the plurality of signals may be filtered based at least in part on an associated respective cutoff frequency. For example, each of the plurality of signals may be filtered using a low pass filter thereby generating a corresponding filtered signal having an associated signal noise level at or below the threshold noise level. By low pass filtering each signal in accordance with a respective corresponding cutoff frequency, noise components having frequencies above the cutoff frequency may be sufficiently attenuated, thereby resulting in a reduction in the total noise power and a signal noise level for the filtered signal that is at or below the threshold noise level.

Figure 7:
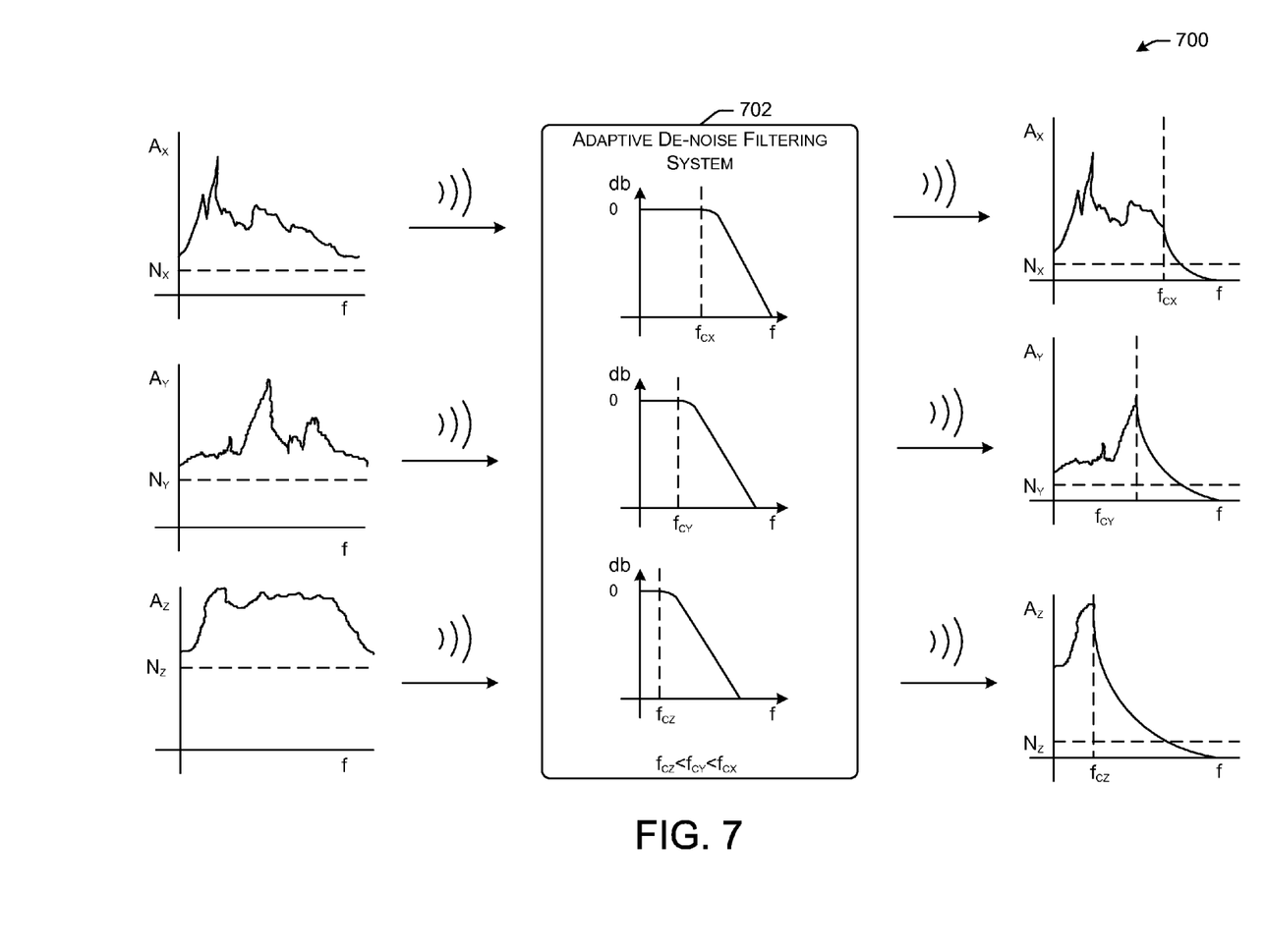
FIG. 7 is a hybrid system and data flow diagram depicting an illustrative set of filtered signals that may be generated by an illustrative adaptive de-noise filtering technique in accordance with one or more embodiments of the disclosure.

FIG. 7 is a hybrid system and data flow diagram depicting an illustrative set of filtered signals that may be generated by an illustrative adaptive de-noise filtering technique in accordance with one or more embodiments of the disclosure.

A plurality of signals is depicted as being supplied as input to an adaptive de-noise filtering system 702. The adaptive de-noise filtering system 702 may be any combination of hardware, firmware and/or software configured to perform one or more adaptive de-noise filtering techniques according to one or more embodiments of the disclosure. As a non-limiting example, software and/or firmware for performing adaptive de-noise filtering may be provided in connection with hardware forming part of an electronic device, in which case, the electronic device as a whole may form part of the adaptive de-noise filtering system 702 or the combination of the software and/or firmware and the hardware for executing the software and/or firmware may form part of the system 702.

Each of the plurality of signals input to the adaptive de-noise filtering system 702 is depicted as exhibiting different noise characteristics compared to the other signals. In particular, a signal noise level $N_z$ associated with a first signal is greater than a signal noise level $N_y$ associated with a second signal which, in turn, is greater than a signal noise level $N_x$ associated with a third signal.

The adaptive de-noise filtering system 702 may receive the plurality of signals and perform adaptive de-noise filtering in accordance with one or more of the embodiments disclosed herein. As part of the de-noise filtering, the system 702 may determine respective cutoff frequencies for each of the plurality of signals and may low pass filter each signal in accordance with the associated cutoff frequency. Illustrative frequency responses showing different cutoff frequencies for the low pass filtering of each of the signals are depicted in FIG. 7. As shown, a highest cutoff frequency is used to low pass filter the signal having the lowest signal noise value $N_x$, and a lowest cutoff frequency is used to low pass filter the signal having the highest signal noise value $N_z$ because more aggressive filtering may be required to reduce the noise floor of the signal having a signal noise value of $N_z$ to a threshold noise level.

FIG. 7 also depicts plots of the filtered signals in the frequency domain. As shown, each of the filtered signals has a respective noise signal level that is substantially the same as the noise signal levels of other filtered signals. In various embodiments, the noise signal levels of the filtered signals may correspond to noise floors at or below the threshold noise value. Attenuation of the signal that encodes meaningful information at frequencies above the respective cutoff frequencies is also shown.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations have been described for performing adaptive de-noise filtering in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to illustrative embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed:

1. One or more non-transitory computer-readable storage media comprising computer-executable instructions that responsive to execution by one or more processors cause operations to be performed comprising:
    applying a high pass filter to a first signal to obtain a first plurality of estimated noise levels for the first signal, wherein each estimated noise level of the first plurality of estimated noise levels corresponds to a respective time of the first signal;
    applying a first low pass filter to the plurality of estimated noise levels to obtain a first signal noise level;
    applying the high pass filter to a second signal to obtain a second plurality of estimated noise levels for the second signal, wherein each estimated noise level of the second plurality of estimated noise levels corresponds to a respective time of the second signal;
    applying the first low pass filter to the second plurality of estimated noise levels to obtain a second signal noise level;
    determining a first cutoff frequency based at least in part on the first signal noise level and a second cutoff frequency based at least in part on the second signal noise level;
    applying a second low pass filter to the first signal based at least in part on the first cutoff frequency to obtain a first filtered signal; and
    applying a third low pass filter to the second signal based at least in part on the second cutoff frequency to obtain a second filtered signal.

2. The one or more non-transitory computer-readable storage media of claim 1, wherein the high pass filter is a differentiation function and the first low pass filter is a smoothing function.

3. The one or more non-transitory computer-readable storage media of claim 1, wherein the first cutoff frequency and the second cutoff frequency are further determined based at least in part on a threshold noise level that is less than or equal to a minimum of the first signal noise level or the second signal noise level.

4. The one or more non-transitory computer-readable storage media of claim 1, wherein:
    the first signal noise level is greater than the second signal noise level, and
    the first cutoff frequency is lower than the second cutoff frequency.

5. The one or more non-transitory computer-readable storage media of claim 1, wherein a noise level of the first filtered signal is substantially the same as a noise level of the second filtered signal.

6. The one or more non-transitory computer-readable storage media of claim 1, wherein the first signal and the second signal encode information captured by a first sensor and a second sensor, respectively, of a multi-sensor device.

7. A method, comprising:
    applying, by one or more computers comprising one or more processors, a high pass filter to a signal to obtain a plurality of estimated noise levels;
    applying, by the one or more computers, a first low pass filter to the plurality of estimated noise levels to obtain a noise level for the signal;
    determining, by the one or more computers, a cutoff frequency based at least in part on the noise level; and
    applying, by the one or more computers, a second low pass filter to the signal based at least in part on the cutoff frequency to obtain a filtered signal.

8. The method of claim 7, wherein the cutoff frequency is further determined based at least in part on a threshold noise level that corresponds to a target noise level associated with the filtered signal.

9. The method of claim 7, wherein the cutoff frequency is further determined based at least in part on a slope of a roll-off of the second low pass filter.

10. The method of claim 9, wherein the metric indicative of the noise level is one of: i) an rms noise value, ii) a decibel noise value, or iii) a total noise power value.

11. The method of claim 7, wherein applying the high pass filter to the signal comprises:
    sampling, by the one or more computers, the signal at a sampling rate to identify a plurality of sampled signal values; and
    differentiating, by the one or more computers, the plurality of sampled signal values to generate a plurality of differentiated signal values.

12. The method of claim 11, wherein each estimated noise level of the plurality of estimated noise levels is respectively associated with a corresponding subset of a plurality of subsets of the differentiated signal values, and
    wherein applying the first low pass filter to the plurality of estimated noise levels comprises:
        applying, by the one or more computers, an averaging function to the plurality of estimated noise levels to generate a metric indicative of the noise level.

13. The method of claim 12, wherein the metric indicative of the noise level is an exponential weighted average.

14. The method of claim 12, wherein each of the plurality of estimated noise levels comprises a root mean square (RMS) value associated with the corresponding subset of the plurality of subsets of the differentiated signal values.

15. The method of claim 7, wherein the plurality of estimated noise levels is a first plurality of estimated noise levels, the noise level is a first noise level, the cutoff frequency is a first cutoff frequency, and the filtered signal is a first filtered signal, the method further comprising:
   applying, by the one or more computers, the high pass filter to a second signal to obtain a second plurality of estimated noise levels;
   applying, by the one or more computers, the first low pass filter to the second plurality of estimated noise levels to obtain a second noise level for the second signal, wherein the second noise level is different from the first noise level;
   determining, by the one or more computers, a second cutoff frequency based at least in part on the second noise level; and
   applying, by the one or more computers, a third low pass filter to the second signal based at least in part on the second cutoff frequency to obtain a second filtered signal.

16. The method of claim 15, wherein a noise level corresponding to noise associated with the first filtered signal and a noise level corresponding to noise associated with the second filtered signal each do not exceed threshold noise level.

17. The method of claim 15, wherein the first signal and the second signal encode data representative of measurements along a first axis and a second axis, respectively, of a multi-axis inertial sensor.

18. The method of claim 7, wherein the high pass filter is a first-order single-pole high pass infinite impulse response (IIR) filter and the second low pass filter is a first-order single-pole low pass IIR filter.

19. A system, comprising:
   at least one processor; and
   at least one memory storing computer-executable instructions,
   wherein the at least one processor is configured to access the at least one memory and to execute the computer-executable instructions to:
      apply a high pass filter to a signal to obtain a plurality of estimated noise levels;
      apply a first low pass filter to the plurality of estimated noise levels to obtain a noise level for the signal;
   determine a cutoff frequency based at least in part on the noise level;
   apply a second low pass filter to the signal based at least in part on the cutoff frequency to generate a filtered signal.

20. The system of claim 19, wherein at least one of the high pass filter, the first low pass filter, or the second low pass filter is a digital filter comprising computer-executable instructions stored in at least a portion of the at least one memory.

21. The system of claim 19, wherein the second low pass filter comprises one of: i) a Butterworth filter, ii) a Chebyshev filter, or iii) a Bessel filter.

22. The system of claim 19, wherein the cutoff frequency is further determined based at least in part on a roll-off slope associated with the second low pass filter.

23. The system of claim 19, wherein the high pass filter comprises a differentiation function and the first low pass filter comprises an averaging function.

24. The system of claim 19, wherein the high pass filter is a first-order single-pole high pass infinite impulse response (IIR) filter and the second low pass filter is a first-order single-pole low-pass IIR filter.

25. The system of claim 19, wherein an output of the high pass filter substantially comprises noise frequencies.

* * * * *